United States Patent
Dejugnac et al.

[11] Patent Number: 5,814,916
[45] Date of Patent: Sep. 29, 1998

[54] METHOD OF MANUFACTURING A PIEZOSENSITIVE MATERIAL OR A MAGNETIC MATERIAL

[75] Inventors: Corinne C Dejugnac, La Seyne/Mer; Alain A Scarpitta, Toulon; Michel M Boisrayon, Le Beausset, all of France

[73] Assignee: Etat Francais Represented by the Delegue General, Paris, France

[21] Appl. No.: 783,328

[22] Filed: Jan. 15, 1997

[30] Foreign Application Priority Data

Jan. 15, 1996 [FR] France .................................. 96 00368

[51] Int. Cl.⁶ ................................................. H01L 41/18
[52] U.S. Cl. ............................ 310/311; 310/362; 435/177
[58] Field of Search ....................... 310/311, 362; 435/177, 179, 176

[56] References Cited

U.S. PATENT DOCUMENTS

| | | | |
|---|---|---|---|
| 4,214,887 | 7/1980 | Van Gelder | 71/9 |
| 4,407,054 | 10/1983 | Zipfel, Jr. | 29/25.35 |
| 4,935,467 | 6/1990 | Cheng et al. | 525/199 |
| 5,094,947 | 3/1992 | Nakajima et al. | 435/105 |

FOREIGN PATENT DOCUMENTS

| | | |
|---|---|---|
| 2 719 181 | 10/1995 | France . |
| 57-102188 | 6/1982 | Japan . |

OTHER PUBLICATIONS

Patent Abstracts of Japan vol. 006, No. 191 (C–127) 30 Sep. 1982.

*Primary Examiner*—Mark O. Budd
*Assistant Examiner*—Timothy A. Williams
*Attorney, Agent, or Firm*—Oliff & Berridge, PLC

[57] ABSTRACT

The invention relates to the areas of piezoelectricity and magnetism, and relates in particular to a composite material having piezoelectric or magnetic properties and a method for manufacturing the same. The composite material can be used, for example, in piezosensitive sensors or in magnetic sensors. The method according to the invention includes culturing microorganisms in a nutrient medium in the presence of a piezoelectric powder or magnetic powder. The microorganisms fix or ingest the powder, and are subsequently extracted from the nutrient medium and dehydrated to obtain dry particles. The dry particles are then compacted or inserted into a matrix to constitute the composite material. The microorganisms can optionally be separated from the particles prior to compaction of the particles or insertion of the particles into the matrix.

10 Claims, 3 Drawing Sheets

METHOD OF MANUFACTURING A PIEZOSENSITIVE MATERIAL OR A MAGNETIC MATERIAL

BACKGROUND OF THE INVENTION

1. Field of the Invention

The invention relates to the areas of piezoelectricity and magnetism, and relates in particular to piezoelectric or magnetic materials and a method for manufacturing the same.

2. Description of Related Art

In the area of piezoelectricity and magnetism, the use of composite materials including a matrix and particles within the matrix is known.

Such composite materials can be used in certain devices such as magnetometers, compasses, or magnetic direction finders.

The magnetic composites currently made employ particles or grains of magnetic substances derived from materials such as ferrites, e.g., magnetic iron oxide (FeO) ($Fe_2O_3$), natural ferrite made of $Fe^{2+}$ and $Fe^{3+}$ ions, or other ferrites based on Co, Cu, Mn, Mg, or Li associated with $Fe^{2+}$ and $Fe^{3+}$ ions in the oxide form.

These grains of magnetic substance have one major drawback: their sizes and shapes are fairly irregular, because they are obtained by grinding operations, possibly with additional screening operations. The grinding and screening operations very substantially increase the cost of manufacturing the grains. Moreover, high-quality magnetic compounds must have a high level of physical and chemical homogeneity, which is not necessarily ensured by the manufacturing process described.

A piezoelectric composite material can be used in sensors of the electromechanical transducer type. These transducers can be used in hydrophones, accelerometers, hydrostatic pressure sensors, deformation, force, or temperature sensors, or complex systems that can combine these functions. These transducers can also be used in air, microphones, teletype or computer keyboards, heat detectors, or piezochrome coatings.

One drawback to the piezoelectric materials containing piezoelectric particles and described in the prior art resides in the fact that the piezoelectric particles have sizes greater than one micron, with the size distribution ranging from a few microns to several hundred microns. As with magnetic composite materials, one condition for obtaining a high-quality piezoelectric composite material is regularity of particle size and shape, as explained in U.S. Pat. No. 4,407,054 for example.

French Patent Application FR9413743 published under number 2719181 partially overcomes this drawback. French Patent Application FR9413743 describes variable-polarization piezosensitive devices using a piezosensitive material composed of a) piezoelectric particles and a matrix of either a polymer or a dielectric organic compound, wherein the organic compound is either non-piezoelectric or slightly piezoelectric, or b) an agglomerate of particles.

French Patent Application FR9413743 also describes several methods for manufacturing these particles depending on a desired size of the particles.

For example, one can use a guillotine to cut particles from sheets, plates or wires of piezoelectric plastics. The piezoelectric plastics can be prepolarized in the thickness direction.

Also, when monocrystals of mineral origin such as brushite or Seignette salt (i.e., sodium potassium tartrate) are synthesized, the crystallization process can be speeded up by shaking the solution using vibration or ultrasound. Crystallides of far smaller size than the particles generally obtained by ordinary methods are formed in this manner.

Also, when biological materials which themselves have piezoelectric properties are used, these materials can be divided by differential ultra-centrifugation; this technique yields particles with an approximate size of 5 anometers (nm).

However, the size and shape of the particles obtained by these methods still have a certain dispersion inherent in the manufacturing method.

SUMMARY OF THE INVENTION

Hence, one of the goals of the invention is to furnish a method for obtaining piezosensitive or magnetic particles with increased regularity of size and shape.

Accordingly, a method for manufacturing particles according to the invention includes the steps of culturing at least one microorganism in a nutrient medium in the presence of a piezosensitive powder or magnetic powder, wherein the microorganism is able to fix the powder, extracting the microorganism from the nutrient medium after culturing after fixing a certain quantity of piezosensitive or magnetic material, and dehydrating the microorganisms to obtain dry particles.

According to one aspect of the invention, the microorganisms are dehydrated by freeze-drying.

According to another aspect of the invention, the microorganisms are extracted from the culture by centrifuging.

This method can also be used to make a piezosensitive or magnetic material. In this case, the method further includes compacting the dry particles or inserting them into a matrix to constitute a composite material for forming the desired material.

Thus, according to the invention, a piezosensitive or magnetic material includes piezosensitive or magnetic particles, wherein the particles include dehydrated microorganisms.

According to an aspect of the invention, at least some of the particles have an envelope made of a piezosensitive material inside which a dehydrated microorganism is located.

According to another aspect of the invention, the articles are nearly spherical and are between 1 and 6 microns ($\mu$m) in size.

According to another characteristic, the aforesaid particles are rod-shaped and are between 1 and 10 $\mu$m long and 0.5 $\mu$m and 5 $\mu$m wide.

A "charged microorganism" means a microorganism such as a bacterium, a yeast, a fungus, or a protozoan that has fixed a certain quantity of piezosensitive matter.

According to one aspect of the invention, if the microorganisms fix the piezosensitive or magnetic powders inside their cells, then the method can include separating the piezosensitive or magnetic particles from the microorganisms after dehydrating the charged microorganisms. The separation process may include immersing the charged microorganisms in Javel water.

If the piezosensitive or magnetic particles are not separated from the microorganisms after dehydrating the charged microorganisms, then at least some of the particles are enclosed in an envelope made of a dehydrated microorganism.

The nutrient medium can, for example, be solid and include agar, or can be liquid, e.g., a nutrient broth type liquid.

The piezosensitive powder can be chosen from Seignette salt, tartaric acid, lithium sulfate, ammonium dihydrogen phosphate, potassium dihydrogen phosphate, ammonium tartrate, potassium tartrate, diamine ethylene tartrate, dipotassium tartrate, sodium chlorate, sodium bromate, nickel sulfate hexahydrate, iodic acid, terpene monohydrate, benzophenone, hydrated or dehydrated lithium gallate, synthetic alkylglutamate or arylglutamate polypeptides, poly-γ-methyl-L-glutamates, poly-γ-benzylglutamates, copolymers of β-hydroxybutarate or β-hydroxyvalerate, poly-β-hydroxybutarates, monosaccharides, disaccharides, oligosaccharides, homopolysaccharides, heteropolysaccharides, glycosaminoglycans, carboxylic acid salts, brushite, monetite, cholesterols and sterols, urea, amino acids, dipeptides or polypeptides, nucleotides, or nucleic acids.

The piezosensitive particles obtained by the method according to the invention can be compacted to form a piezosensitive agglomerate or inserted into a matrix of a polymer or of an organic dielectric compound, wherein the dielectric compound is either non-piezoelectric or slightly piezoelectric, to form a composite piezosensitive material that can be used in transducers.

Colonies of magnetic microorganism strains obtained according to the invention can for example be used as living organisms, as sensitive elements for designing sensors having a certain intelligence, or, in the inert powder state, as trace elements for medical purposes.

Other advantages and characteristics of the present invention will emerge from the following description of embodiments directed to hydrophones.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1A:
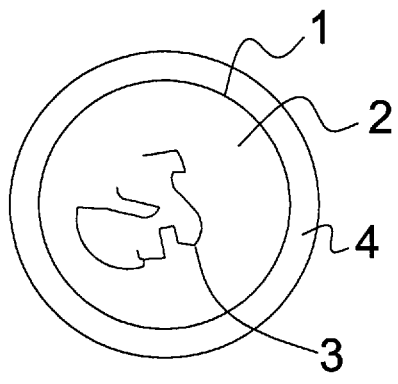
FIGS. 1a, 1b and 1c show example shapes of microorganisms charged with piezosensitive material or magnetic material.
Figure 1B:
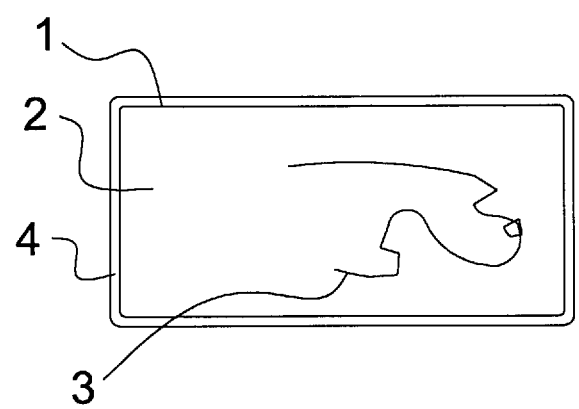

FIGS. 1a and 1b are two examples of shapes of microorganisms charged with piezosensitive or magnetic material. The microorganisms are shown schematically by a membrane 1, cytoplasm 2, and DNA 3. In these examples, the piezosensitive or magnetic material 4 is attached to a periphery of the microorganism, and the piezosensitive or magnetic particle obtained upon conclusion of the manufacturing process has dimensions similar to those of the carrier microorganism. Thus, the largest dimension of a particle of this type ranges from a few microns to several hundred microns and the geometry of the piezosensitive or magnetic element obtained is that of the microorganism serving as a carrier.

Figure 1C:
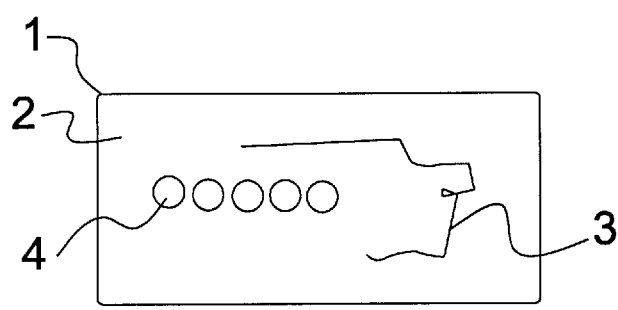

FIG. 1c shows another example of a microorganism charged with piezosensitive or magnetic material. In this example, the microorganism has ingested the piezosensitive or magnetic material, and then fixed it in its cytoplasm 2 in particle form. The fixed particles thus obtained all have very similar dimensions once they have recrystallized in the cytoplasm. The geometry of these particles is fixed and is defined by the crystalline structure of the starting lattice of the material before it is dissolved in a nutrient medium and ingested by a microorganism.

In the case of FIGS. 1a and 1b, called Case A, microorganisms, e.g., yeasts or bacteria are cultured in a nutrient medium which also contains the piezosensitive or magnetic substance that is to be fixed to the surfaces of the cells.

The nutrient medium may be an agar or a liquid nutrient medium. The use of agar allows the development of microorganism colonies to be controlled.

The piezosensitive or magnetic substance is in the form of a powder. The grain size of the powder generally does not exceed 100 microns if the substance is piezosensitive, and or 20 microns if the substance is magnetic. The powder is incorporated into the agar after a lethal concentration of the piezosensitive or magnetic substance has been determined. The lethal concentration is a concentration that is lethal to the microorganisms. This concentration varies according to the nature of the substance. It is approximately 2% for hydrated lithium sulfate and approaches 10% for tartaric acid, both of which are piezosensitive substances. Powdered iron, which is a magnetic substance, is lethal in a concentration of approximately 10%.

The use of certain non-lethal substances such as Seignette salt in the case of piezosensitive substances may be recommended for this reason.

The piezosensitive or magnetic substance is incorporated into agar by melting the agar at an appropriate temperature which must in no event exceed the melting point of the substance. This is because certain substances may lose their properties irreversibly if they are overheated. In Case A, it is preferable to use a nutrient liquid and not an agar.

The powder particles are sterilized before mixing. Subsequent operations should preferably be conducted in a sterile medium or under a laminar-flow hood. The mixture of agar and particles should be stirred continuously until cooling is complete. It is very important to obtain an agar whose surface film is impregnated with the substance, at an appropriate concentration.

After the agar cools, it is seeded by depositing colonies of microorganisms on its surface. The duration of incubation is approximately 48 hours. During the incubation time, colony growth is monitored by regular sampling and observation under a microscope. Following the incubation, the colonies of microorganisms are scraped off the surface of the agar with a multichannel pipette. For very small quantities, one may use a loop. The use of agar is, however, less effective in Case A than the use of a nutrient solution.

Nutrient solution can come in the form of a fairly thick liquid called a broth which contains the same nutrient elements (e.g., proteins, sugars, vitamins, and water in proper proportions) as the agar. The composition of the broth depends on the microorganisms used.

As before, the piezosensitive or magnetic substance is in the form of a powder. The grain size of the powder does not generally exceed 100 microns for a piezosensitive substance, or 20 microns for a magnetic substance. The powder is incorporated into the broth after the lethal concentration of the piezosensitive or magnetic substance has been determined, as in the case of agar. A lethal concentration is approximately 2.5% for hydrated lithium sulfate, and approaches 10% for tartaric acid and 10% for powdered iron. Certain substances such as Seignette salt are not lethal and can be recommended for this reason.

The powder is poured into the nutrient broth at room temperature. To facilitate dissolution of the powder, in certain cases the broth can be heated to temperatures not exceeding 30° C.

The powder particles must be sterilized before being mixed in the broth. Subsequent operations should preferably be conducted in a sterile medium or under a laminar-flow hood. The particle-laden broth must be continuously stirred until the particles have completely dissolved.

After the powder particles have completely dissolved in the broth, colonies of microorganisms are introduced into the broth and the broth is left to stand. The duration of incubation is approximately 48 hours at 37° C. During the incubation time, colony growth is monitored by regular sampling and observation under a microscope. After incubation, the microorganisms are recovered from the broth by centrifuging the broth in a centrifuge tube for a suitable period of time until a residue forms. The supernatant liquid above the residue is drawn off by a pipette and the residue is recovered with a spatula.

The microorganisms recovered after these operations from either an agar or a broth are then freeze-dried as follows.

The principle of freeze-drying is to sublimate the solvents present in a sample by cooling them to a low temperature at low pressure. For this purpose, the microorganisms recovered are pre-frozen until they are solid. The next step is to reduce the temperature of a container in which the frozen samples will be placed. When the temperature of the container reaches $-20°$ C., a cooling circuit of a trap is turned on to draw off solvent vapors from the samples. This operation lasts an average of 15 minutes, and is complete when the temperature of the trap reaches $-45°$ C. The samples are then placed in the container which is at $-20°$ C. and exposed to a vacuum. During the vacuum exposure step, a pressure within the container is first reduced in stages until the pressure inside the container is $3\times10_{-2}$ Pa. The reduction of pressure inside the container to $3\times10_{-2}$ Pa lasts about 30 minutes. If the volume of the samples is 50 ml, the samples are then left to freeze-dry for about 24 hours at a pressure of $3\times10_{-2}$ Pa 24 hours, to ensure a good result for the freeze-drying operation.

In the case of FIG. 1c, called Case B,. the method differs from the method used in Case A only in the final phase, which involves an additional operation in which particles ingested by the microorganisms are extracted.

Piezosensitive or magnetic particles can be extracted from microorganisms recovered after freeze-drying by immersing the microorganisms in an aqueous solution to which Javel water has been added. The Javel water dissolves the membranes of the cell walls of the microorganisms in a few hours. The solution is then evaporated to obtain a residue from which the piezosensitive or magnetic particles are separated by ultra-centrifugation. The particles obtained in Case B are smaller than those obtained in Case A and require delicate and expensive extraction operations.

In both Case A and Case B, the particles finally obtained can be compacted to form a piezosensitive agglomerate or inserted into a polymer matrix or a matrix of an organic dielectric compound to form a composite piezosensitive material, wherein the organic dielectric compound is either non-piezoelectric, or slightly piezoelectric.

The material of which the polymer matrix or the matrix of the organic dielectric compound is made can be chosen from polystyrenes, polysulfones, polycarbonates, polypropylenes, polyethylene, polyethylene terephthalates, polyphenylene oxides, polyurethane elastomers, polyvinylcarbazoles and polyvinylidene fluorides, polyacrylate or polymethacrylate esters, polyvinyl chlorides, polyvinylidenes, acrylonitrile or ethacrylonitrile polymers, polyvinyl acetates, celluloids, cellulose acetates, polyvinylpyrrolidones, cellulose polymers, phenol-formaldehydes, phenol-furfural resins, soluble polyimide polymers, epoxy resins, polymerizable resins, natural rubbers, synthetic rubbers, silicone resins, carbinol or bone glues, polystyrols, shellacs, or vinylidene and trifluorethylene copolymers.

In a first example, piezosensitive material is made according to the invention using yeasts and Seignette salt on solid media. The particular microorganism used is a yeast called *Saccharomyces cerevisiae* which is a eukaryote cell. This cell has the feature that its size is relatively large, approximately 5 microns.

The method requires preparation of a solid culture medium. Sabouraud agar (from the Biocar Company) is chosen as the preferred medium. This agar is particularly suitable for selection, identification, and culturing of yeasts and molds.

It is prepared as follows. Forty-five grams of dehydrated powdered agar are placed in one liter of distilled water to form a medium and left to stand 5 minutes without stirring the medium, after which the medium is stirred using a mechanical blade-type stirrer until a homogenous suspension called Alpha is obtained. During the latter operation, the medium is heated slowly in a temperature-controlled dish until a temperature close to the boiling point is reached. It is not necessary for stirring to be continuous but it must be frequent. The operation ceases when the powdered agar is completely dissolved.

An antibiotic with a very broad antimicrobial spectrum is added to the Alpha medium at a concentration of 100 mg/L to render the Alpha medium more selective and hence reduce development of unwanted bacteria or microorganisms.

The Alpha medium is then sterilized in an autoclave at 120° C. for 20 min. After sterilization it is cooled to approximately 45° C.

The piezosensitive substance used is granular Seignette salt. This powder is in the form of grains that have an average size of 500 microns and a maximum size of 1 mm. The powder is sterilized using an ultraviolet lamp at a wavelength of 254 nm. The powder is then mixed with the Alpha medium held at a temperature of 45° C. The Alpha medium must be sufficiently liquid for mixing to occur, but the temperature of the mixture must be low enough for the piezosensitive substance not to liquefy. The Seignette salt has a melting point of 55° C. After mixing, the Beta medium is obtained.

The quantity of the piezosensitive substance mixed in the culture medium is chosen to obtain a final concentration that is nontoxic to yeasts. The concentration of Seignette salt to yeasts has been determined by a prior cytotoxicity study. It is approximately 0.1 grams per gram of Alpha medium. Powdered Seignette salt in an amount of 50 grams is used to produce the Beta medium, which is below the lethal concentration of 100 grams of Seignette salt.

A volume of 20 ml of Beta medium thus obtained is poured into a Petri dish 9 cm in diameter.

A stock solution for seeding is made by dilution so as to produce a concentration of 3000 yeast organisms per ml of the stock solution. Thus, when 100 µl of this stock solution are seeded, approximately 300 isolated colonies appear without forming a continuous sheet.

Calcium salts (calcium carbonate and calcium acetate) are used to weaken the yeast membrane. When the yeast membrane is weakened, it becomes easier to penetrate. These calcium salts are prepared at the concentration of 50 g/l.

For a given Beta culture medium containing Seignette salt, 0.2 ml of stock solution can thus be mixed with 0.1 ml of calcium acetate. The stock solution modified with calcium salts will be called Gamma.

It will be noted that, before this Gamma stock solution is used, it is left to stand for 5 minutes at room temperature to allow the calcium salt to act on the yeasts.

In the next phase, 100 µl of Gamma stock solution is spread on the Beta medium. This medium is incubated in an oven for 24 hours at 37° C. After this operation, a continuous or discontinuous layer of Seignette salt is deposited on the outer surface of the yeast membrane. The colonies are then scraped from the surface with a loop or, for larger quantities, with a multichannel pipette.

To monitor the effectiveness of the method, the yeasts modified by the process are removed and deposited in a drop of dielectric liquid (silicone oil for example) which itself is placed between two Scotch Copper flat electrodes glued to a glass slide, and an electric field of at least 200 V/mm is applied between these electrodes. The yeasts then form alignments perpendicular to the electrodes.

In a later phase, the removed colonies are freeze-dried and then inserted into a polymer matrix to form a composite material.

Thus, for example, a hydrophone using such a material in which the matrix is a silicone resin supplied by the Rhodorsyl Company can be made, wherein the following process is used to form the material-electrode assembly.

A silicone resin is in the form of a resin A and a hardener B.

Forty grams of resin A and four grams of hardener B are mixed in a mixer to form a prepolymer mixture. Then, about 2 grams of Seignette salt particles are gradually incorporated into the prepolymer mixture until homogenization is complete. The mixture is then degassed using a vacuum pump.

Figure 2:
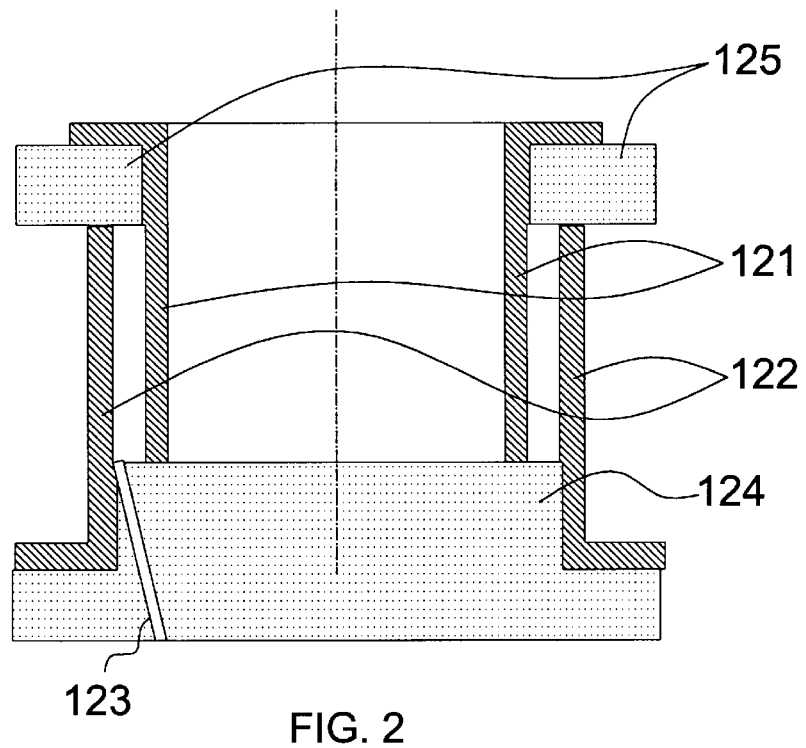
FIG. 2 is a diagram of a mold for making a piezoelectric material according to the invention.
Figure 3:
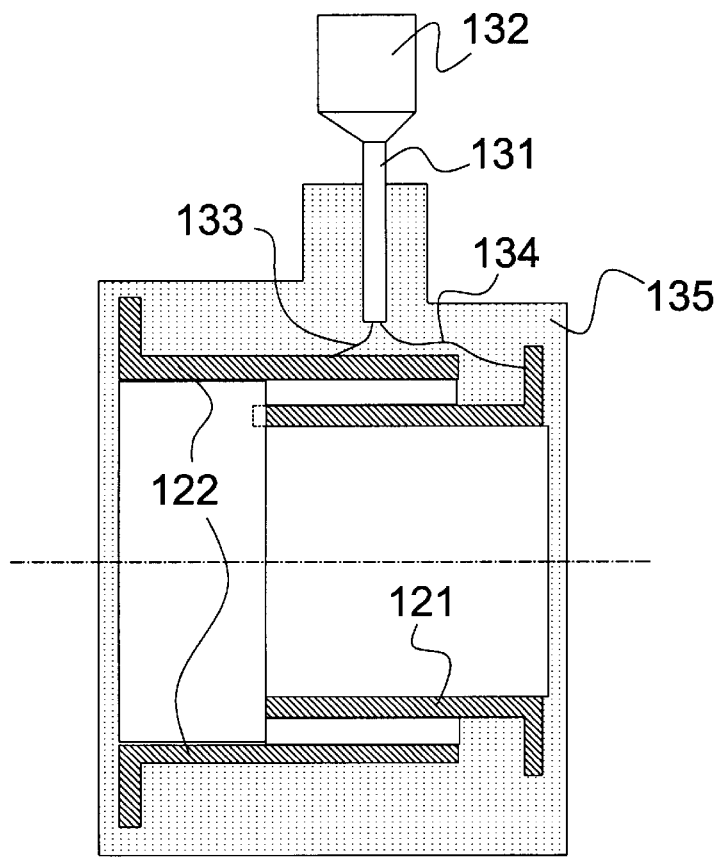
FIG. 3 is a diagram of a hydrophone manufactured according to the present invention.

With the resin still in the prepolymer state, the mixture is injected thorough an injection orifice 123 into a mold, shown in FIG. 2, made of plastic and provided with metal electrodes. The mold has the shape of a cylinder, and has two Plexiglas™ parts 124, 125. The electrodes are made of two metal cylinders 121 and 122 of aluminum bronze. The mixture of resin and Seignette salt microcrystals is left to polymerize for 48 hours. A coaxial electrical cable 131, which has a plug 132 at its outer end, is connected to electrodes 121 and 122, as shown in FIG. 3. A braid 133 of cable 131 is connected to the outer electrode 122. A central conductor 134 of cable 131 is connected to the inner electrode 121. The assembly is placed in another mold (not shown) to receive an outer polyurethane resin coating 135. During this operation, a part of cable 131 is coated with coating 135. This produces a sensor which is used as a hydrophone.

In a second example, a magnetic material can be made according to the invention using yeasts and powdered iron on a solid medium. The method is the same as in the first example described above using yeasts and Seignette salt on solid media, with the exception of the substances used. A type FeO.OH powdered iron oxide weighing 80 g replaces the Seignette salt to produce the Beta medium, and is ingested by the yeasts during the 24-hour incubation stage at 37° C.

In order to monitor the effectiveness of the method, the yeasts modified by the process are removed and deposited in a drop of distilled water. The drop of water is placed in an air gap of an electromagnet in which magnetic induction is at least one Tesla. The yeasts then form alignments perpendicular to the surfaces of poles of the electromagnet.

In a third example, piezosensitive material is made according to the invention using yeasts and Seignette salt in a liquid medium. The liquid culture medium is a liquid called Sabouraud broth supplied by the Biocar Company. It is prepared as follows. Thirty grams of powdered agar are placed in one liter of distilled water, and then the medium is stirred in a blade-type stirrer until a homogenous suspension called Alpha is obtained. During the latter operation, the medium is heated slowly in a temperature-controlled bath to a temperature close to the boiling point. It is not necessary for stirring to be continuous but it must be frequent. The operation ceases when the powdered Agar has dissolved completely.

An antibiotic with a broad antimicrobial spectrum is added to the Alpha medium at a concentration of 100 mg/L to make the Alpha medium more selective and hence reduce development of unwanted bacteria or microorganisms.

The Alpha medium is then sterilized by autoclaving it at 120° C. for 15 min. After sterilization it is then reduced to a temperature of approximately 45° C.

The piezosensitive substance used is granular Seignette salt. This powder is in the form of grains having an average size of 500 microns and a maximum size of 1 mm. The powder is sterilized under an ultraviolet lamp operating at a wavelength of 254 nm. It is then added to and mixed with the Alpha medium held at a temperature of 45° C. The mixing temperature must be low enough for the piezosensitive substance not to liquefy. Thus, the mixing temperature must be held lower than 55° C., the melting point of Seignette salt. After mixing, the Beta medium is obtained.

The quantity of piezosensitive substance mixed into the culture medium is chosen such that the eventual concentration is nontoxic to the yeasts. A concentration lethal to the yeasts was determined by a prior cytotoxicity study. It is approximately 0.05 grams of Seignette salt per gram of Alpha medium. Hence, 25 g of powdered Seignette salt is used to produce the Beta medium.

A stock solution is made to yield a yeast concentration of 3000 per ml of the stock solution. As in Example 1, the yeasts used belong to the strain *Saccharomyces cerevisiae*.

Calcium salts (calcium carbonate and calcium acetate) are used to weaken the yeast membrane. When the yeast membrane is weakened, it becomes easier to penetrate. These calcium salts are prepared at a concentration of 50 g/l.

For a given Beta culture medium containing Seignette salt, 200 µl of stock solution can thus be mixed with 100 µl of calcium carbonate or 200 µl of stock solution with 100 µl of calcium acetate. The stock solution modified with calcium salts will be called Gamma.

It will be noted that, before this Gamma solution is used, it is left to stand for 5 minutes at room temperature to allow the calcium salt to act on the yeasts.

The Gamma suspension is then mixed with the Beta solution in a proportion of 100 µl of Gamma solution to 50 ml of Beta solution.

After mixing, the broth is left to stand. The duration of incubation is approximately 48 hours at 37° C. During this time, colony growth is monitored by regular sampling and observation under a microscope.

The yeasts are then recovered by centrifugation at 4500 rpm for 15 minutes. The supernatant liquid is drawn off with a pipette and the residue is rinsed with distilled water. The residue is recovered after a second centrifugation at 4500 rpm for 15 minutes, by means of one or more micropipettes connected to an automatic command and control system.

In a later phase, the colonies sampled are freeze-dried then compacted.

Figure 4:
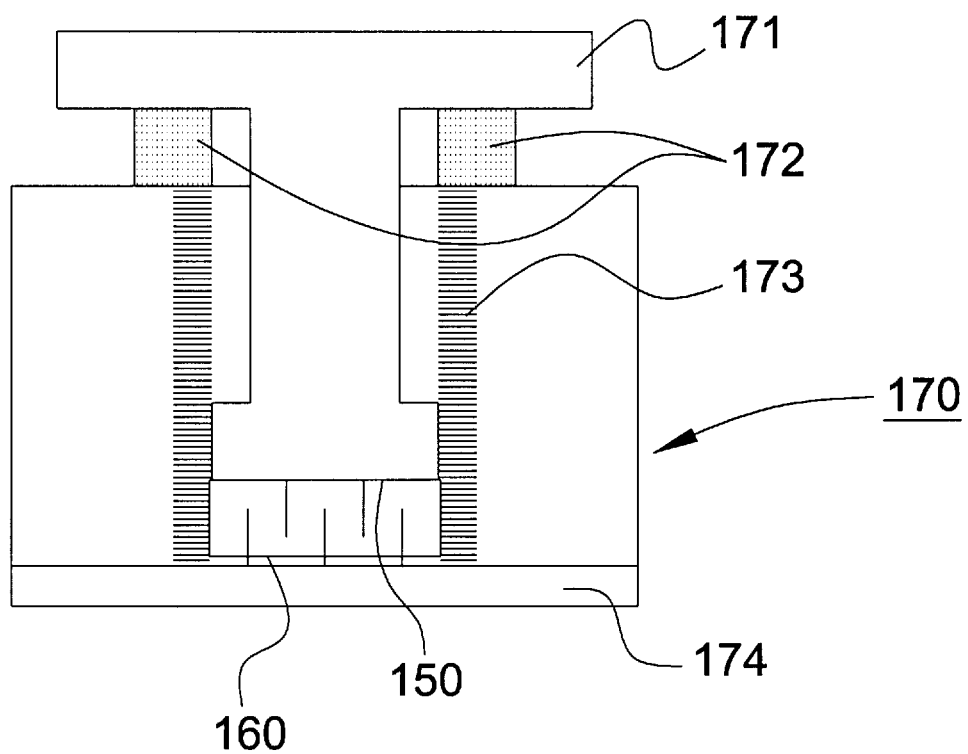
FIG. 4 shows a tool for making a piezosensitive material according to the invention.

As illustrated in FIG. 4, the process of compacting freeze-dried particles may be as follows. The electrodes 150, 160 chosen in this example are comb-type electrodes, namely the type described in Patent Application FR94.05991. They consist of a plate (not shown) measuring 49 mm by 49 mm, and strips (not shown) perpendicular to the plate, 1 mm thick, with a spacing between two consecutive strips of 3 mm.

The piezosensitive or magnetic particles according to the invention are distributed between the strips of electrode 150, and electrode 160 is positioned so that each strip of the electrode 160 is inserted between two strips of the electrode 150. The space between two consecutive strips is 1 mm.

A pressure of 20 MPa is then applied for five minutes to the assembly described above using a tool 170.

The tool 170 has, principally, a plunger 171, two pacers 172, a pressure chamber 173, and a base 174.

Pressure can be applied until a homogenous agglomerate is obtained; the homogeneity can be monitored by visual inspection, measuring the characteristic dimensions, at rest, of the product obtained.

In a fourth example, magnetic material is made according to the invention using yeasts and powdered iron in a liquid medium. The method is the same as in the third example described above, with the exception of the substances used. A type FeO.OH powdered iron oxide weighing 100 g replaces the Seignette salt to produce the Beta medium. The lethal concentration is 0.1 grams of powdered iron oxide per gram of Alpha medium, and 100 µl of Gamma suspension are mixed with 1500 ml of Beta solution.

In order to monitor the effectiveness of the method, the yeasts modified by the process are deposited in a drop of distilled water. The drop of water is placed in an air gap of an electromagnet in which magnetic induction is at least one Tesla. The yeasts then form alignments perpendicular to the surfaces of poles of the electromagnet.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the scope of the invention as defined in the following claims.

What is claimed is:

1. A plurality of particles wherein at least one of the plurality of particles comprises dehydrated microorganisms contained within an envelope made of at least one of a piezosensitive material and a magnetic material.

2. The plurality of particles according to claim 1, wherein the at least one of the plurality of particles is nearly spherical in shape and is between 1 µm and 6 µm in size.

3. The plurality of particles according to claim 1, wherein the at least one of the plurality of particles is rod-shaped, between 1 µm and 10 µm in length, and between 0.5 µm and 5 µm in width.

4. The plurality of particles according to claim 1, wherein the at least one of the plurality of particles comprises powered iron oxide.

5. The plurality of particles according to claim 1, wherein the at least one of the plurality of particles comprises at least one of Seignette salt, tartaric acid, lithium sulfate, ammonium dihydrogen phosphate, potassium dihydrogen phosphate, ammonium tartrate, potassium tartrate, diamine ethylene tartrate, dipotassium tartrate, sodium chlorate, sodium bromate, nickel sulfate hexahydrate, iodic acid, terpene monohydrate, benzophenone, hydrated or dehydrated lithium gallate, synthetic alkylglutamate or arylglutamate polypeptides, poly-γ-methyl-L-glutamates, poly-γ-benzylglutamates, copolymers of β-hydroxybutarate, copolymers of β-hydroxyvalerate, poly-β-hydroxybutarates, monosaccharides, disaccharides, oligosaccharides, homopolysaccharides, heteropolysaccharides, glycosaminoglycans, carboxylic acid salts, brushite, monetite, cholesterols and sterols, urea, amino acids, dipeptides, polypeptides, nucleotides, and nucleic acids.

6. A plurality of particles wherein at least one of the plurality of particles comprises:
    an envelope made of a dehydrated microorganism; and
    at least a portion of at least one of a piezosensitive and a magnetic material, wherein the envelope surrounds the portion of material.

7. The plurality of particles according to claim 6, wherein the at least one of the plurality of particles comprises powered iron oxide.

8. The plurality of particles according to claim 6, wherein the at least one of the plurality of particles comprises at least one of Seignette salt, tartaric acid, lithium sulfate, ammonium dihydrogen phosphate, potassium dihydrogen phosphate, ammonium tartrate, potassium tartrate, diamine ethylene tartrate, dipotassium tartrate, sodium chlorate, sodium bromate, nickel sulfate hexahydrate, iodic acid, terpene monohydrate, benzophenone, hydrated or dehydrated lithium gallate, synthetic alkylglutamate or arylglutamate polypeptides, poly-γ-methyl-L-glutamates, poly-γ-benzylglutamates, copolymers of β-hydroxybutarate, copolymers of β-hydroxyvalerate, poly-β-hydroxybutarates, monosaccharides, disaccharides, oligosaccharides, homopolysaccharides, heteropolysaccharides, glycosaminoglycans, carboxylic acid salts, brushite, monetite, cholesterols and sterols, urea, amino acids, dipeptides, polypeptides, nucleotides, and nucleic acids.

9. A magnetic sensor comprising a plurality of particles, wherein at least one portion of said plurality of particles comprises a magnetic material and a dehydrated microorganism.

10. A piezosensitive sensor comprising a plurality of particles, wherein at least one portion of said plurality of particles comprises a piezosensitive material and a dehydrated microorganism.

* * * * *